(12) United States Patent
Yoo et al.

(10) Patent No.: US 8,236,733 B2
(45) Date of Patent: Aug. 7, 2012

(54) METHOD OF FORMING A PRECURSOR SOLUTION FOR METAL ORGANIC DEPOSITION AND METHOD OF FORMING SUPERCONDUCTING THICK FILM USING THE SAME

(75) Inventors: Sang-Im Yoo, Seoul (KR); Seung-Hyun Moon, Gyeonggi-do (KR); Geo-Myung Shin, Seoul (KR)

(73) Assignees: Seoul National University Industry Foundation, Seoul (KR); Sunam Co., Ltd., Gyeonggi-do (KR)

( * ) Notice: Subject to any disclaimer, the term of this patent is extended or adjusted under 35 U.S.C. 154(b) by 453 days.

(21) Appl. No.: 12/506,189

(22) Filed: Jul. 20, 2009

(65) Prior Publication Data

US 2011/0015079 A1 Jan. 20, 2011

(51) Int. Cl.
*H01L 39/24* (2006.01)
*C09D 5/24* (2006.01)
*B05D 5/12* (2006.01)

(52) U.S. Cl. .......................... 505/470; 106/1.18; 427/62

(58) Field of Classification Search .................. 505/470; 106/1.18; 427/62
See application file for complete search history.

(56) References Cited

U.S. PATENT DOCUMENTS

| | | | |
|---|---|---|---|
| 4,880,770 A | 11/1989 | Mir et al. | |
| 4,918,051 A | 4/1990 | Mantese et al. | |
| 4,962,088 A | 10/1990 | Micheli et al. | |
| 5,231,074 A | 7/1993 | Cima et al. | |
| 2006/0246216 A1 * | 11/2006 | Hong et al. | 427/62 |

FOREIGN PATENT DOCUMENTS

| | | |
|---|---|---|
| JP | 2-263709 A | 10/1990 |
| KR | 20060117088 A | 11/2006 |
| KR | 10-0665587 B1 | 12/2006 |
| KR | 10-0694850 B1 | 3/2007 |
| KR | 10-0820747 B1 | 4/2008 |
| WO | WO-91/16149 A1 | 10/1991 |
| WO | WO-98/58415 A1 | 12/1998 |
| WO | WO-01/08236 A1 | 2/2001 |

OTHER PUBLICATIONS

Shi et al., "The development of YBa2Cu3Ox thin films using a fluorine-free sol-gel approach for coated conductors", Supercond. Sci. Technol. 17 (2004) 1420-1425.*
Lee et al., "New Chemical Route for YBCO Thin Films", IEEE Transactions on Applied Superconductivity, 13(2), Jun. 2003, 2743-2746.*
Kenichi Tsukada et al. "Preparation of eptaxial $YBa_2Cu_3O_{7-y}$ films on $CeO_2$-buffered yttria-stabilized zirconia substrates by fluorine-free metalorganic deposition", Physica C 458 (2007) 29-33.

* cited by examiner

*Primary Examiner* — Douglas Mc Ginty
(74) *Attorney, Agent, or Firm* — Rabin & Berdo, P.C.

(57) ABSTRACT

A method for forming a precursor solution for metal organic deposition includes dissolving an additive-free first precursor composed of a rare earth element, a second precursor comprising barium, and a third precursor composed of copper into an acid to form a compound solution; dissolving the compound solution into a solvent to form a pre-precursor solution; and evaporating the solvent from the pre-precursor solution to form a precursor solution having an increased viscosity; wherein at least one of the first precursor, the second precursor, and the third precursor is dissolved into a fluorine-free acid. A method for forming a superconducting thick film from the above precursor solution includes forming a thick film by a one-time coating of the precursor solution having an increased viscosity onto a biaxially-textured base followed by heat treating to form the superconducting thick film having a thickness of about 0.2 μm or more and having no cracking.

7 Claims, 11 Drawing Sheets

METHOD OF FORMING A PRECURSOR SOLUTION FOR METAL ORGANIC DEPOSITION AND METHOD OF FORMING SUPERCONDUCTING THICK FILM USING THE SAME

FIELD OF THE INVENTION

The present invention relates to a method of forming a precursor solution for metal organic deposition and a method of forming a superconducting thick film using the same.

BACKGROUND OF THE INVENTION

Studies have been actively conducted on second-generation high temperature superconducting (HTS) coated conductors to form a thin buffer layer with a biaxially aligned textured structure or a superconducting film on a metal substrate. The second-generation HTS coated conductors have a superior current carrying capability per unit area than conventional metal wires. The second-generation HTS coated conductors can be applied in fields such as electrical power generation with minimal power loss, MRI, superconducting magnetic levitation trains, superconducting propulsion ships, and so on.

The second-generation HTS coated conductors can be fabricated by metal-organic deposition (MOD). For this purpose, a $REBa_2Cu_3O_{7-x}$ based (RE=rare earth element such as Y, La, Nd, Sm, Eu, Gd, Tb, Dy, Ho, Er, Tm, Yb, Lu, etc. or any combination thereof) superconducting film is uniformly coated on a film with a biaxially aligned textured structure and subjected to heat treatment for superconductor synthesis. In order to form an epitaxial superconducting film, a metal-organic precursor solution including superconducting metal ions is needed.

Conventionally, a metal-organic precursor solution showing the best properties required a trifluoroacetate (TFA) solution. According to the conventional method, the precursor solution was prepared by dissolving yttrium (Y)-acetate, barium (Ba)-acetate, and copper (Cu)-acetate into a TFA solution in accordance with cation ratios of a final superconducting product (for example, Y:Ba:Cu=1:2:3), respectively, and then, through a vaporizing distillation process and a remelting-polymerization (refluxing) process, a precursor solution, in which cation ratios of Y, Ba, Cu is 1:2:3, was fabricated. However, when a calcination process is performed by using a precursor solution prepared through the conventional method, a large amount of HF gas produced by reaction of fluorine contained in the precursor with water vapor may be released. The HF gas can be responsible for crack generation when a thick film (about 0.2 μm thick or more) is fabricated. It has been a challenging problem to produce MOD-processed second-generation HTS coated conductors with high critical currents. Therefore, it is impossible to obtain a thick film (about 1 μm thick or more) with only one-time coating process by the conventional method. In order to maximally inhibit cracking generation during fabrication of a thick film (about 1 μm thick or more), a prolonged time for a calcination process is needed, and several applications are required.

SUMMARY OF THE INVENTION

The present invention provides a method of forming a precursor solution for metal organic deposition. The method includes dissolving an additive-free first precursor including a rare earth element, a second precursor including barium, and a third precursor including copper into an acid to form a compound solution; dissolving the compound solution into solvent to form a pre-precursor solution; and evaporating the solvent of the pre-precursor solution to form a precursor solution with the increased viscosity. At least one of the first precursor, the second precursor, and the third precursor is dissolved into a fluorine-free acid.

The precursor solution may form a thick film of about 0.2 μm or more thickness without any cracking through only one-time coating process.

The present invention provides a method of forming a superconducting thick film using a precursor solution formed by the method. The method of forming a superconducting thick film includes dissolving an additive-free first precursor including one rare earth, a second precursor including barium, and a third precursor including copper into an acid to form a compound solution; dissolving the compound solution into solvent to form a pre-precursor solution; evaporating the solvent of the pre-precursor solution to form a precursor solution with the increased viscosity ; and providing a precursor solution with the increased viscosity on a textured base to form a superconducting thick film. At least one of the first precursor, the second precursor, and the third precursor is dissolved into a fluorine-free acid.

The forming of a superconducting thick film may include applying the precursor solution with the increased viscosity on the base and performing a heat treatment. Then, a thick film of about 0.2 μm or more thickness may be formed without any cracking through only one-time coating process.

According to the present invention, a superconducting thick film without any cracking may be fabricated by dissolving at least one of precursors for high temperature superconductors into a fluorine-free acetic acid-based acid to prepare a precursor solution and increasing the viscosity of the precursor solution. Furthermore, time for calcination and firing maybe greatly reduced and a continuous process maybe realized to obtain a superconducting thick film with a high critical currents. The reduction of the process time may be more important when a superconducting thick film coated conductor is formed on a long tape. That is, in order to form a superconducting thick film on several tens of meters of long tape without any cracking, precise process control is required, which can be a factor increasing a process time. Therefore, it is important to reduce a time for calcination and firing.

In addition, when an additive is added to increase the viscosity of a precursor solution, electrical properties of a product may be deteriorated—for example, a critical current density may be reduced even though a thick film may be formed. Conversely, the present invention has the advantage that a thick film with excellent electrical properties can be obtained through only one-time coating process.

DETAILED DESCRIPTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
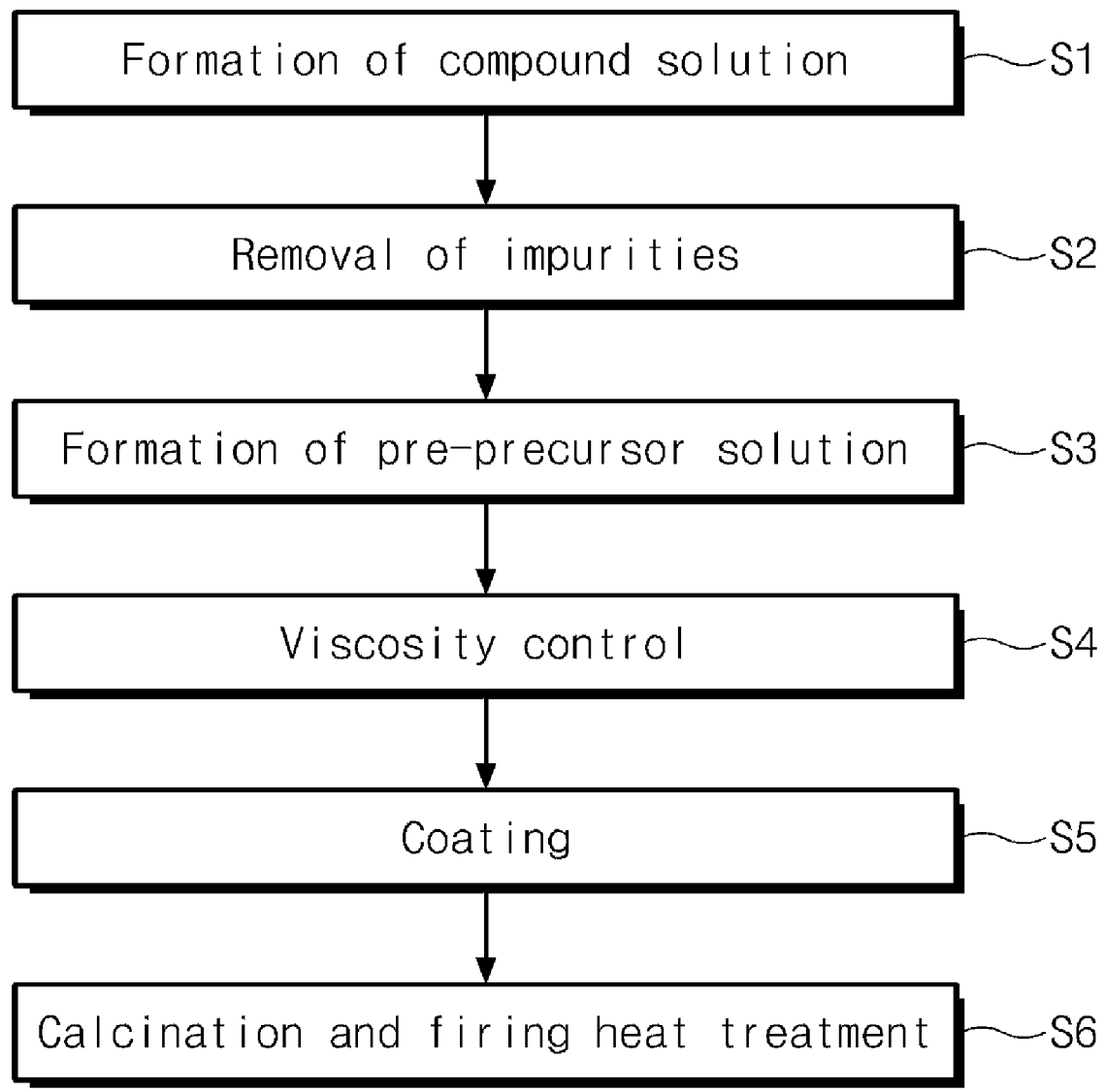
FIG. 1 is a process flowchart illustrating a formation of a precursor solution for metal organic deposition and a formation of a superconducting thick film using the precursor solution according to embodiments of the present invention.

FIG. 1 is a process flowchart illustrating a formation of a precursor solution for metal organic deposition and a formation of a superconducting thick film using the precursor solution according to embodiments of the present invention.

In a first step (S1), a first precursor including a rare earth element, a second precursor including barium, and a third precursor including copper are dissolved into acid to form a compound solution. The rare earth element (RE) may be yttrium (Y) or lanthanum series element or a combination thereof. The lanthanum series element, as well known in the art, includes La, Nd, Sm, Eu, Gd, Tb, Dy, Ho, Er, Tm, Yb, and Lu. The first precursor may be rare earth (RE) acetylacetonate, the second precursor may be barium acetylacetonate or barium acetate, and the third precursor may be copper acetylacetonate. An acid for dissolving at least one of the precursors is fluorine-free acid. For example, an acid for the first and third precursors may be propionic acid or acetic acid. However, a trifluoroacetate (TFA) solution may be added into an acid for the second precursor. It is preferable that the first, the second, and the third precursors may be mixed at a ratio of RE:Ba:Cu=1:2:3. The first precursor includes a rare earth element, and has no particular additive. In general, when an additive is added into precursors, they tend to form a thicker film even through only one-time coating process due to increase in viscosity, but have a problem that electrical properties of the product are deteriorated.

In a second step (S2), the compound solution is heated to be in a viscous jelly state. Accordingly, water vapor and other impurities in the compound solution may be evaporated to be removed.

In a third step (S3), the compound solution in the jelly state is dissolved into solvent to form a pre-precursor. The solvent may be an organic solvent, for example, one selected from the group consisting of methyl alcohol, ethyl alcohol, and methoxy ethanol (methanol glycol mono methyl ether).

Figure 2:
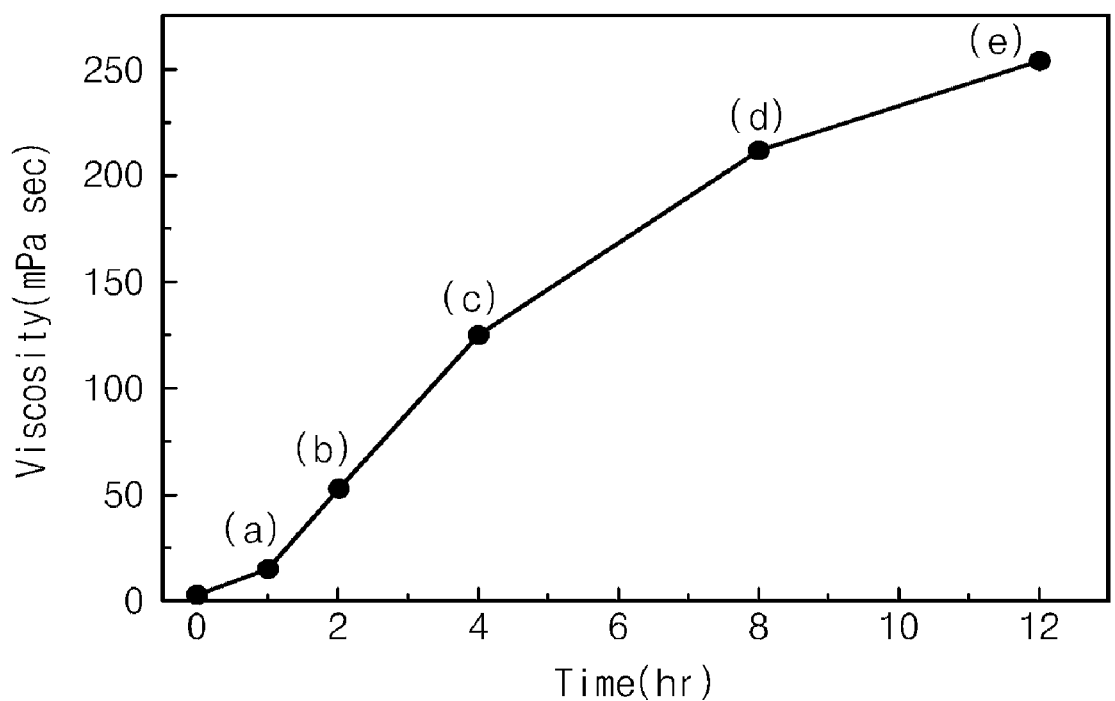
FIG. 2 indicates that the viscosity is increased as heating time increases.

In a fourth step (S4), the solvent of the pre-precursor solution is evaporated to form a precursor solution with an increased viscosity. The pre-precursor solution is heated under air atmosphere to form a precursor solution with an increased viscosity. In order to increase viscosity, the pre-precursor solution is heated at about 80° C. under air atmosphere for about 1 hour to about 12 hours. FIG. 2 indicates that the viscosity is increased as heating time increases. It is preferable that the viscosity of the precursor solution with the increased viscosity may be controlled into about 100 mPa sec to about 225 mPa sec or less. The viscosity will be increased even more, according to a method of calcination and firing heat treatment in a sixth step (S6). Then, it is preferable that a total cation concentration of the precursor solution may be about 0.1 M to about 30 M. As described above, a precursor solution is prepared.

In a fifth step (S5), the precursor solution with the increased viscosity is coated on a substrate by metal organic deposition (MOD). The substrate may be a base with a biaxially textured structure. The base may include a biaxially textured metal, and an oxide buffer layer with a biaxially textured structure on a single-crystal substrate or a metal substrate. The metal or single-crystal substrate may include rolled heat-treated Ni, Ni-based alloy (Ni—W, Ni—Cr, Ni—Cr—W, etc.), silver or silver alloy, and cubic crystal metal such as Ni-silver complex. The oxide buffer layer is formed on Ni, Ni alloy, and stainless steel, and may include ceramic middle layer, MgO, $LaAlO_3$, or $SrTiO_3$. The buffer layer functions to prevent reaction of the base metal with a superconducting layer thereon and transfer the crystallinity of the biaxially textured structure to the superconducting layer.

Figure 3A:
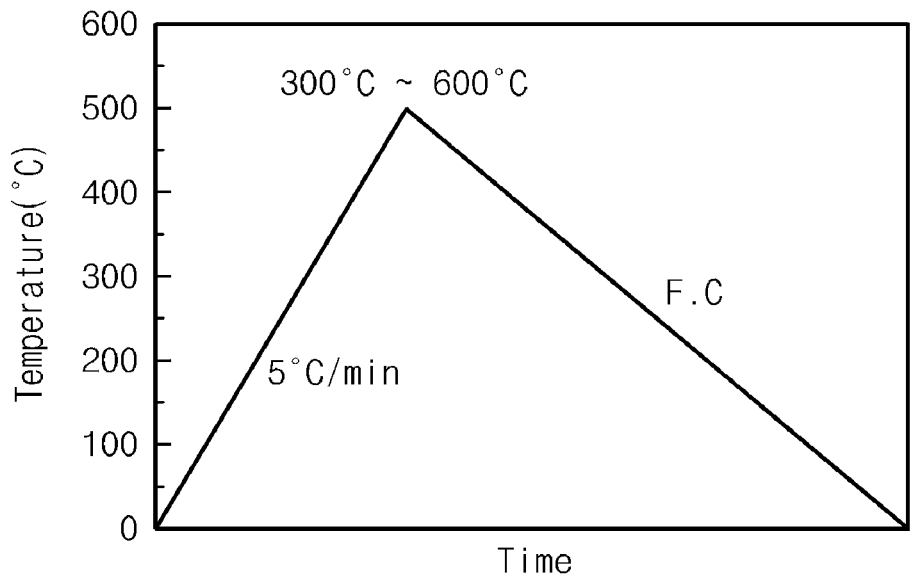
FIGS. 3A and 3B are time vs. temperature graphs describing calcination and firing heat treatments, respectively.
Figure 3B:
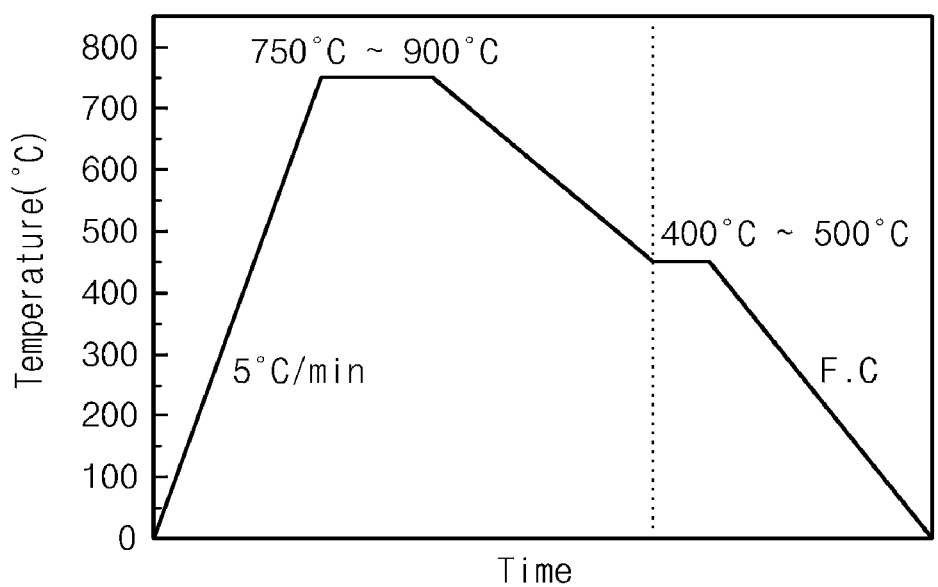
Figure 4A:
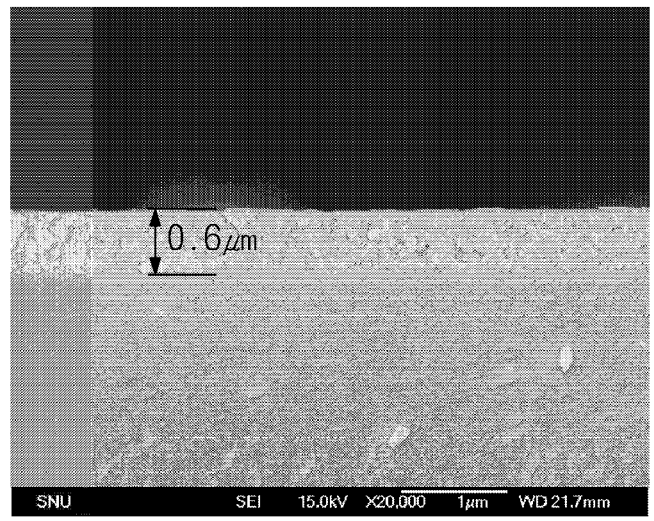
FIGS. 4A to 4E are scanning electron microscope (SEM) photographs illustrating cross-sectional views of a superconducting thick film according to viscosity change.
Figure 4B:
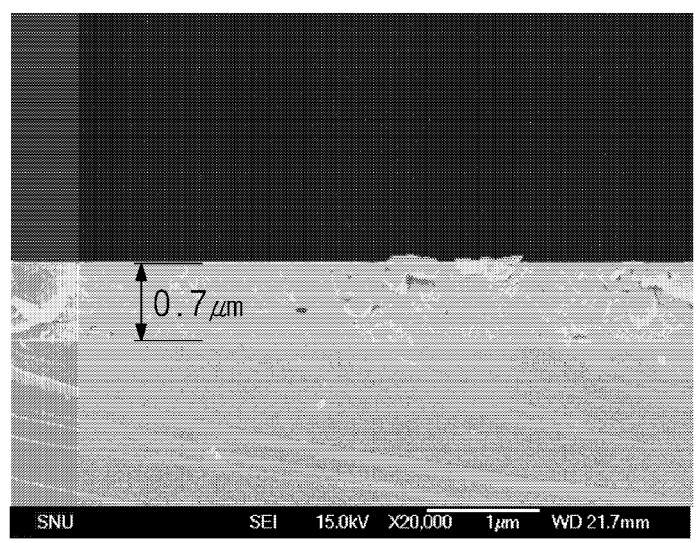
Figure 4C:
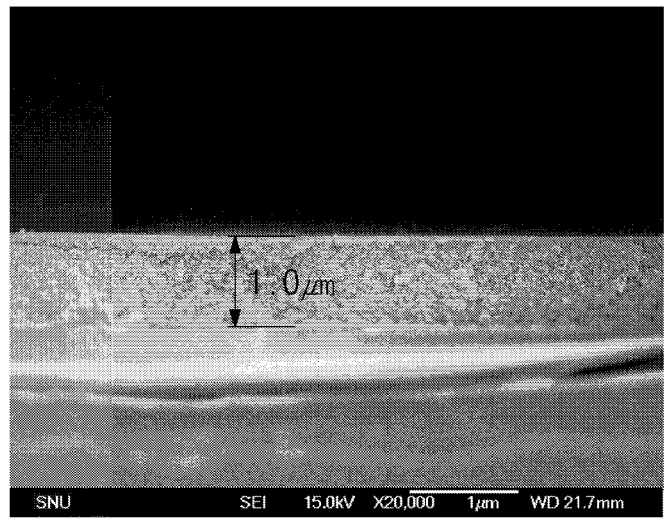
Figure 4D:
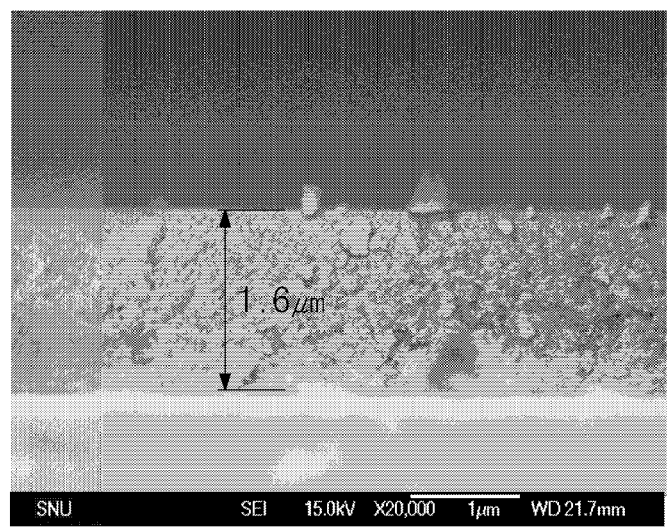
Figure 4E:
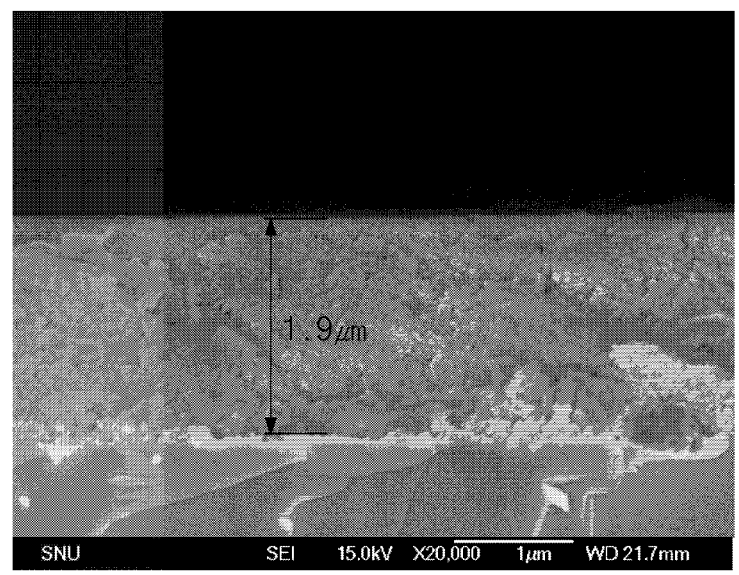

In a sixth step (S6), a precursor film coated on the substrate is subjected to calcination and firing heat treatment to form a superconducting thick film. FIGS. 3A and 3B are time vs. temperature graphs describing calcination and firing heat treatments, respectively. A calcination heat treatment is performed in atmosphere containing oxygen containing saturated water vapor, nitrogen, argon, or a gas mixture thereof at a heating rate of about 1° C./min to about 10° C./min (for example, 5° C./min) until about 300° C. to about 600° C. (for example, 825° C.) to decompose a precursor solution including metal ions. A firing heat treatment is performed at a heating rate of about 5° C./min to about 20° C./min (for example, 5° C./min) until about 800° C. to 950° C. (for example, 825° C.) and maintained for about 2 hours to obtain a small amount of a transient liquid phase. Next, in atmosphere containing dry oxygen containing no water vapor, nitrogen, argon, or a gas mixture thereof, the precursor film is subjected to a free cooling to grow a superconducting phase of uniform composition quickly. During the cooling, the film is maintained at about 400° C. to about 500° C. (for example, 450° C.) in atmosphere containing dry oxygen for about 1 hour to 4 hours (for example, 1 hour) to fill the formed superconducting phase with oxygen sufficiently.

Heat treatment time for calcination and firing may be reduced within about 3 hours in this way. This is a significantly enhanced result, compared with the 20 hours of heat treatment to ensure a film without any cracking by the conventional method.

Figure 5:
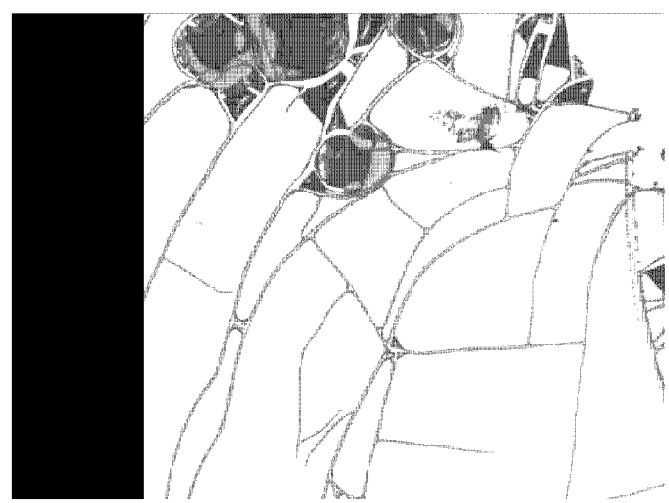
FIG. 5 is a surface scanning electron microscope image of FIG. 4, which shows results after only one-time coating process and a calcination heat treatment.

FIGS. 4A to 4E are scanning electron microscope (SEM) photographs illustrating cross-sectional views of a superconducting thick film according to the viscosity change in the fourth step, and show results after only one-time coating process and a calcination heat treatment. The viscosities of FIGS. 4A to 4E are varied with (a)~(e) of FIG. 2, respectively. FIG. 5 is a surface scanning electron microscope image of FIG. 4E. As the viscosity increases, the thickness of the superconducting thick film increases gradually, but a cracking, that is, a crack is generated at the viscosity of about 250 mPa sec. Therefore, as the viscosity of the precursor solution is increased until a predetermined viscosity, the thickness of the thick film to be applied on a substrate may be sufficiently increased. It is preferable to control the viscosity to a value equivalent to about 100 mPa sec or more. When the viscosity is too low, it was not enough to obtain a thick film thicker than a film prepared by conventional methods. However, the upper maximum of the viscosity maybe increased even more by calcination and firing heat treatment methods. That is, there may be an appropriate heat treatment method to increase the upper maximum of the viscosity.

Figure 6:
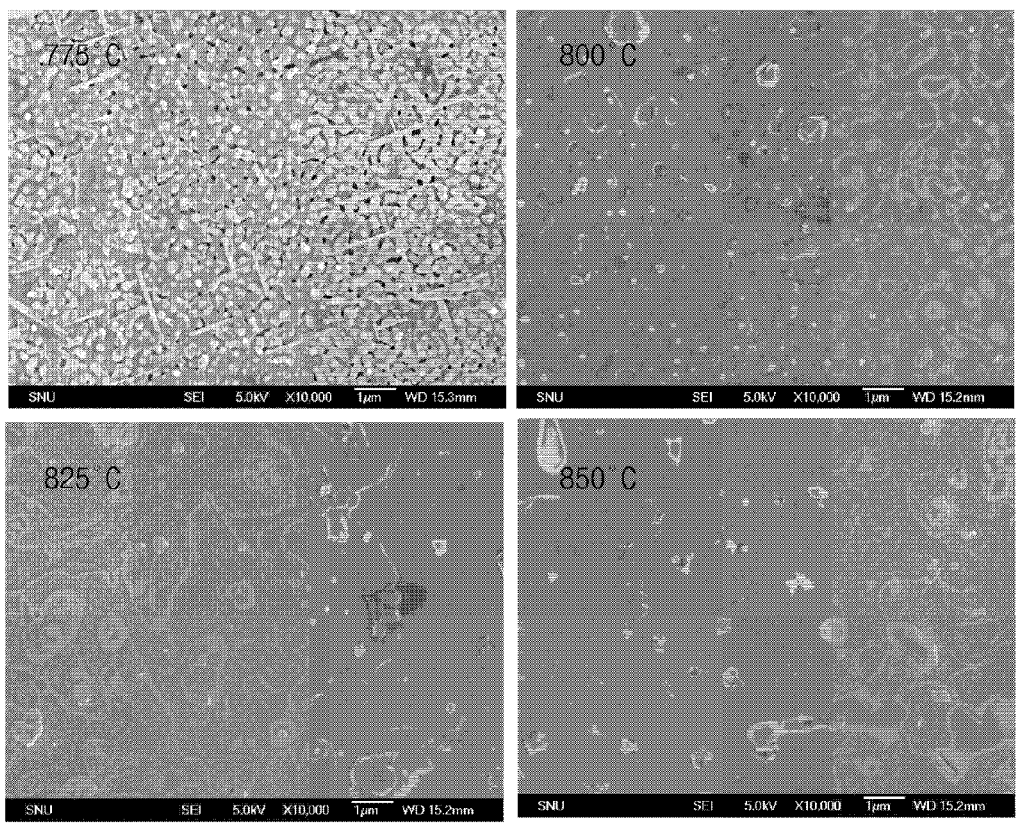
FIG. 6 shows scanning electron microscope images of the surface of a superconducting thick film formed through only one-time coating process under conditions of about 200 mPa viscosity, according to change in calcination heat treatment temperature.

FIG. 6 shows scanning electron microscope images of the surface of a superconducting thick film formed through only one-time coating process under conditions of about 200 mPa viscosity, according to change in firing heat treatment temperature. The heat treatment temperatures were about 775° C., about 800° C., about 825° C., and about 850° C. Superconducting crystal grains were produced at all the temperatures, and the best results are shown at about 825° C.

Figure 7:
FIG. 7 shows a scanning electron microscope (SEM) image of a superconducting thick film formed through only one-time coating process on a substrate after a firing heat treatment.
Figure 7:
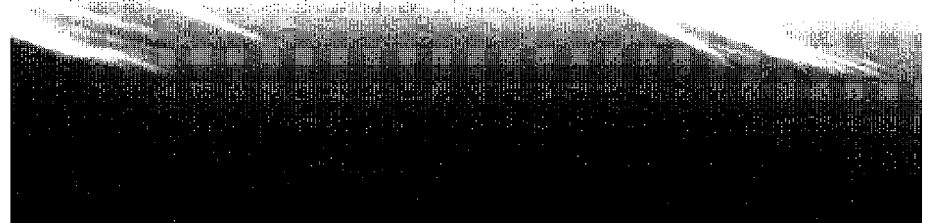

FIG. 7 shows a scanning electron microscope (SEM) image of a superconducting thick film formed through only one-time coating process on a substrate after a firing heat treatment. The thickness of the superconducting thick film was about 0.8 µm. Relatively good results are shown, compared with a film of about 0.2 µm thickness, formed through only one-time coating process in the conventional method. Therefore, the present invention has the advantage that an even thicker superconducting thick film may be obtained only through a one-time or a few applications.

Figure 8:
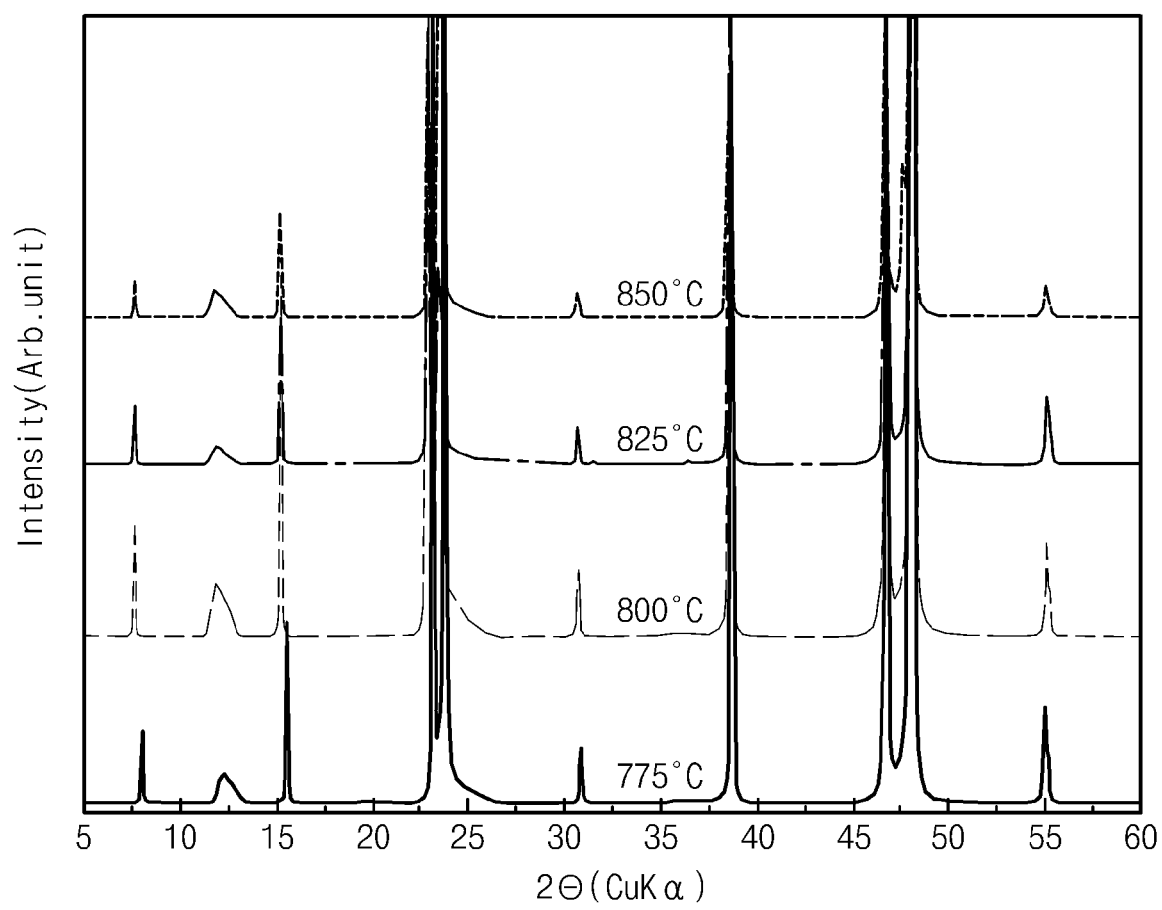
FIG. 8 shows a result of an X-ray diffraction (XRD) of a superconducting thick film according to temperature change in firing heat treatment.

FIG. 8 shows a result of an X-ray diffraction (XRD) and electrical properties of a superconducting thick film according to temperature change in firing heat treatment. Results show that the oxide superconducting phase is highly c-axis oriented under almost all the temperature conditions.

Figure 9:
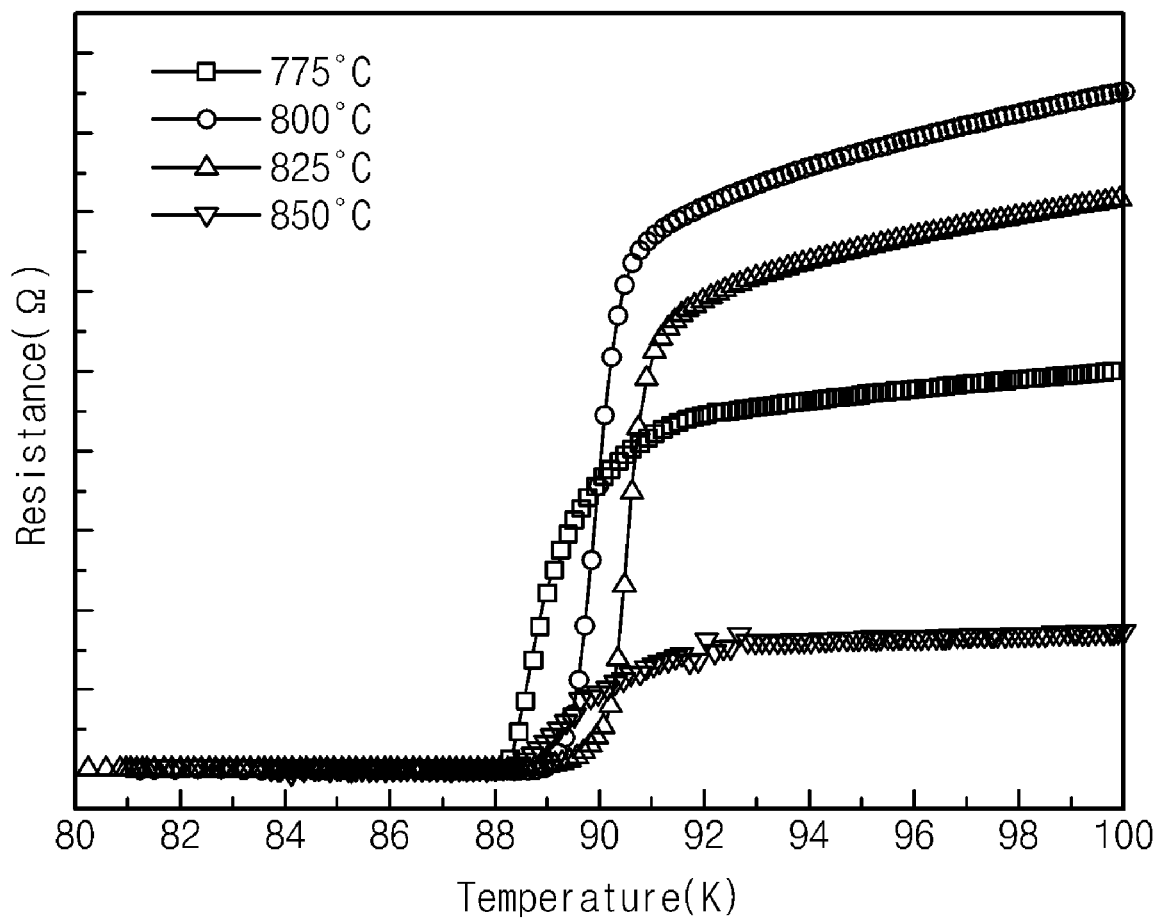
FIG. 9 shows critical transition temperature properties of a superconducting thick film according to temperature change in firing heat treatment.
Figure 10:
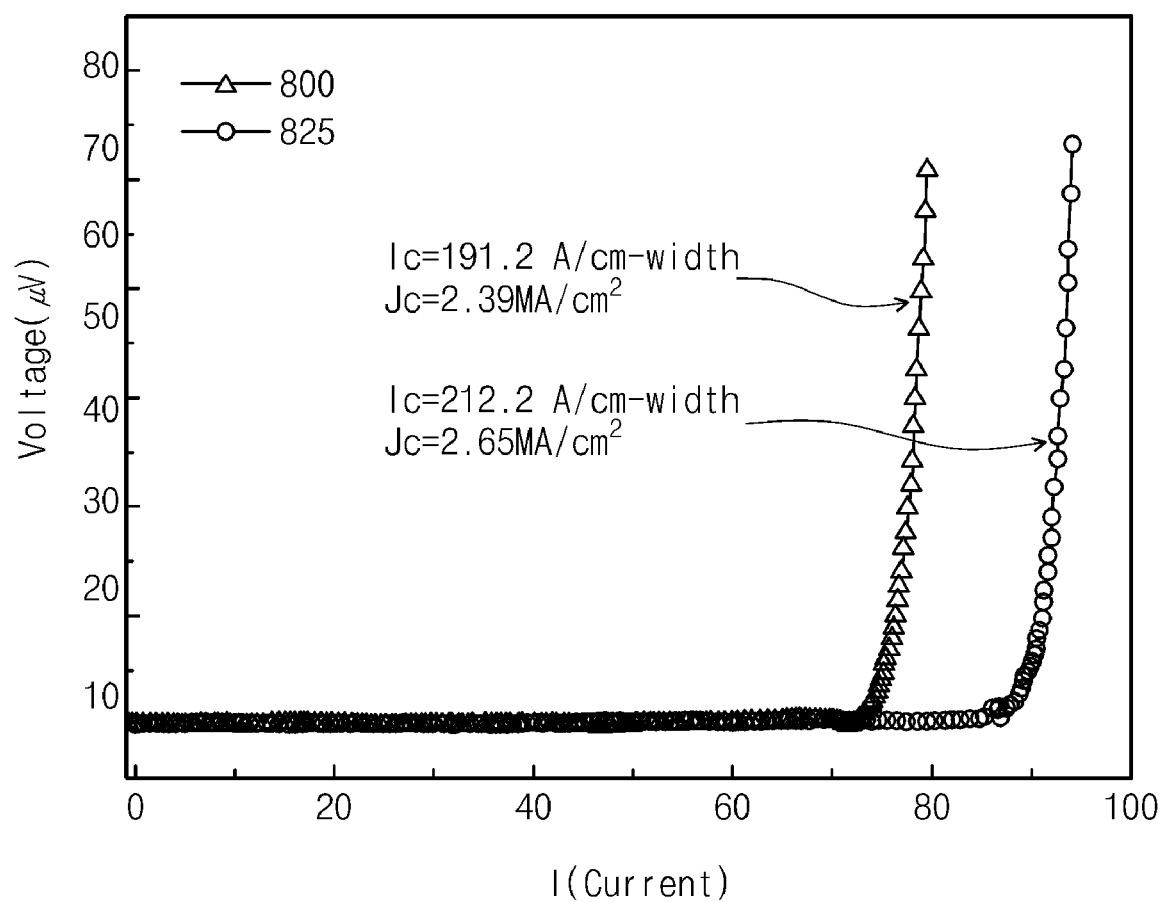
FIG. 10 shows critical current density properties of a superconducting thick film according to temperature change in firing heat treatment.

Referring to FIGS. 9 and 10, electrical properties of a superconducting thick film according to temperature change in firing heat treatment, for example, critical transition temperature and critical current density are described. The best results can be seen when a firing heat treatment was performed at about 825° C. FIG. 9 shows that the state was abruptly changed to the superconducting state at about 90K. FIG. 10 shows a case where the thickness became about 0.8 µm after only one-time coating process and a firing heat treatment. When a firing heat treatment was performed at about 825° C., the critical current density (Jc) was observed at about 2.65 MA/cm$^2$. According to the metal organic deposition method of the present invention, not only a superconducting thick film without any cracking may be formed through only one-time coating process, but also still good results may be obtained without any deterioration of electrical properties of the superconducting thick film formed by the method.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method for forming a precursor solution for metal organic deposition, the method comprising:
    dissolving an additive-free first precursor comprising a rare earth element, a second precursor comprising barium, and a third precursor comprising copper into an acid to form a compound solution;
    dissolving the compound solution into a solvent to form a pre-precursor solution; and
    evaporating the solvent from the pre-precursor solution to form a precursor solution having an increased viscosity;
    wherein at least one of the first precursor, the second precursor, and the third precursor is dissolved into a fluorine-free acid, and
    wherein the precursor solution is configured to form, using a one-time only coating process, a thick film having a thickness of about 0.2 µm or more and having no cracking after heat treatment.

2. The method of claim 1, wherein the first precursor and the third precursor are dissolved into a fluorine-free acid.

3. The method of claim 2, wherein the fluorine-free acid is propionic acid.

4. A method for forming a superconducting thick film, the method comprising:
    dissolving an additive-free first precursor comprising a rare earth element, a second precursor comprising barium, and a third precursor comprising copper into an acid to form a compound solution;
    dissolving the compound solution into a solvent to form a pre-precursor solution;
    evaporating the solvent from the pre-precursor solution to form a precursor solution having an increased viscosity;
    applying, in a one-time only coating process, the precursor solution having an increased viscosity onto a biaxially-textured base to form a thick film; and
    heat treating the thick film under conditions effective to form the superconducting thin film,
    wherein at least one of the first precursor, the second precursor, and the third precursor is dissolved into a fluorine-free acid, and
    wherein the superconducting thick film has a thickness of about 0.2 µm or more and has no cracking.

5. The method of claim 4, wherein the biaxially-textured base comprises a textured metal or an oxide buffer layer with a textured structure on a metal substrate.

6. The method of claim 1, wherein the precursor solution having an increased viscosity has a viscosity of about 100 mPa sec or more.

7. The method of claim 4, wherein the precursor solution having an increased viscosity has a viscosity of about 100 mPa sec or more.

* * * * *